United States Patent
Peng et al.

(10) Patent No.: US 6,211,055 B1
(45) Date of Patent: Apr. 3, 2001

(54) WET-DRY-WET PROCESS IN WET STATION

(75) Inventors: Chun-Hong Peng; Weisheng Chao, both of Hsinchu (TW)

(73) Assignees: ProMOS Technology, Inc.; Mosel Vitelic Inc., both of Hsinchu (TW); Siemens AG, Munich (DE)

(*) Notice: Subject to any disclaimer, the term of this patent is extended or adjusted under 35 U.S.C. 154(b) by 0 days.

(21) Appl. No.: 09/376,661

(22) Filed: Aug. 16, 1999

(51) Int. Cl.[7] ............................................... H01L 21/4763
(52) U.S. Cl. ..................... 438/618; 438/906; 438/689; 134/3; 134/95.2
(58) Field of Search ........................... 134/3, 95.2, 902; 438/618, 622, 624, 689, 906

(56) References Cited

U.S. PATENT DOCUMENTS 5,637,151 * 6/1997 Schulz ........................................ 134/2
5,810,940 * 9/1998 Fukazawa et al. ........................ 134/3
6,153,014 * 11/2000 Song ......................................... 134/2

\* cited by examiner

*Primary Examiner*—Matthew Smith
*Assistant Examiner*—Craig P. Lytle
(74) *Attorney, Agent, or Firm*—W. Wayne Liauh

(57) ABSTRACT

A method for making conductive plugs in a semiconductor wafer. In involves the steps of: (a) forming at least one through hole in a dielectric layer, which is formed above a conductive substrate; (b) subjecting the wafer to a $NH_4OH/H_2O_2$ wet washing process and $HCl/H_2O_2$ wet washing process; (c) drying the wafer; (d) subjecting the wafer to a dilute hydrogen fluoride or buffered hydrogen fluoride wet washing process to remove the native oxide layer that maybe formed on the conductive substrate; (e) drying the wafer again; and (i) filling the at least one through hole with a conductive material to form at least one conductive channel. The wet washing station is modified such that the wet washing processes and the drying process are performed in the same station and without removing the wafer from the washing station during the wet washing and drying process.

19 Claims, 2 Drawing Sheets

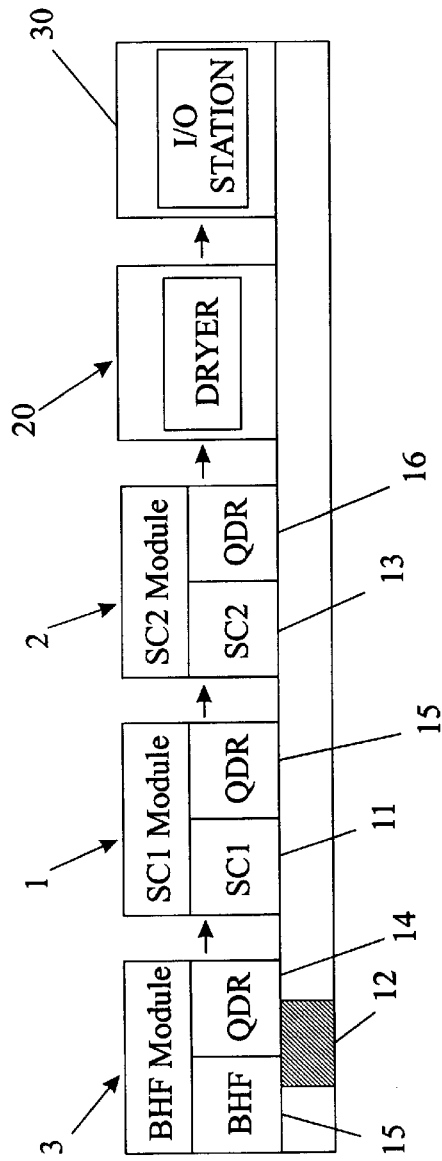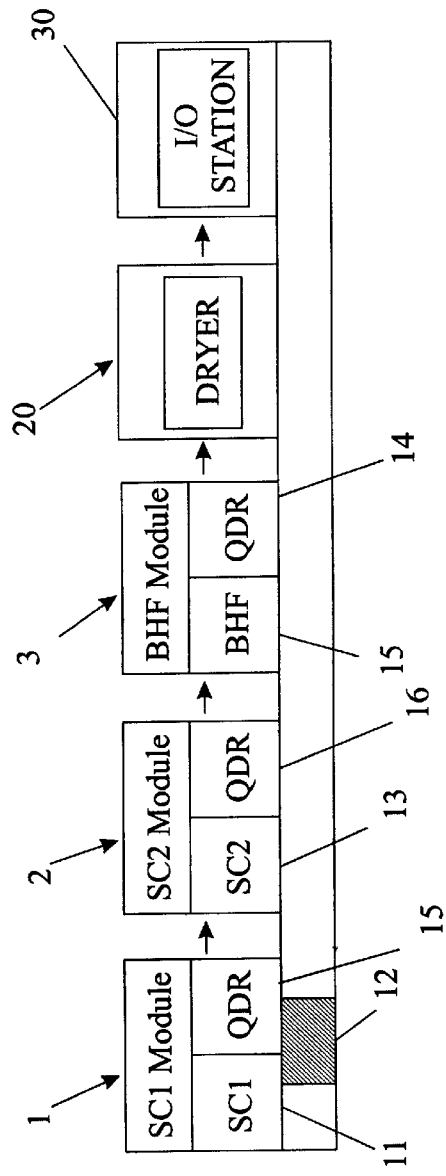

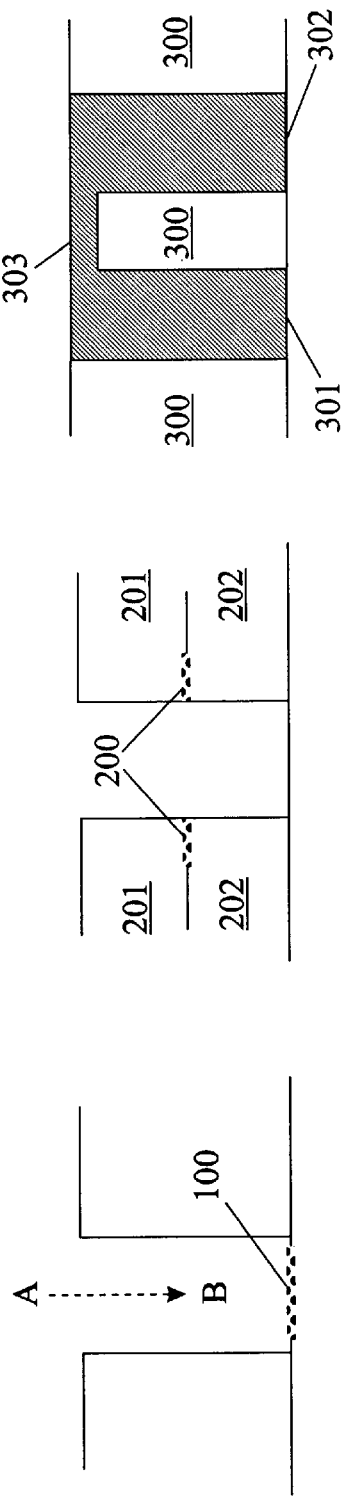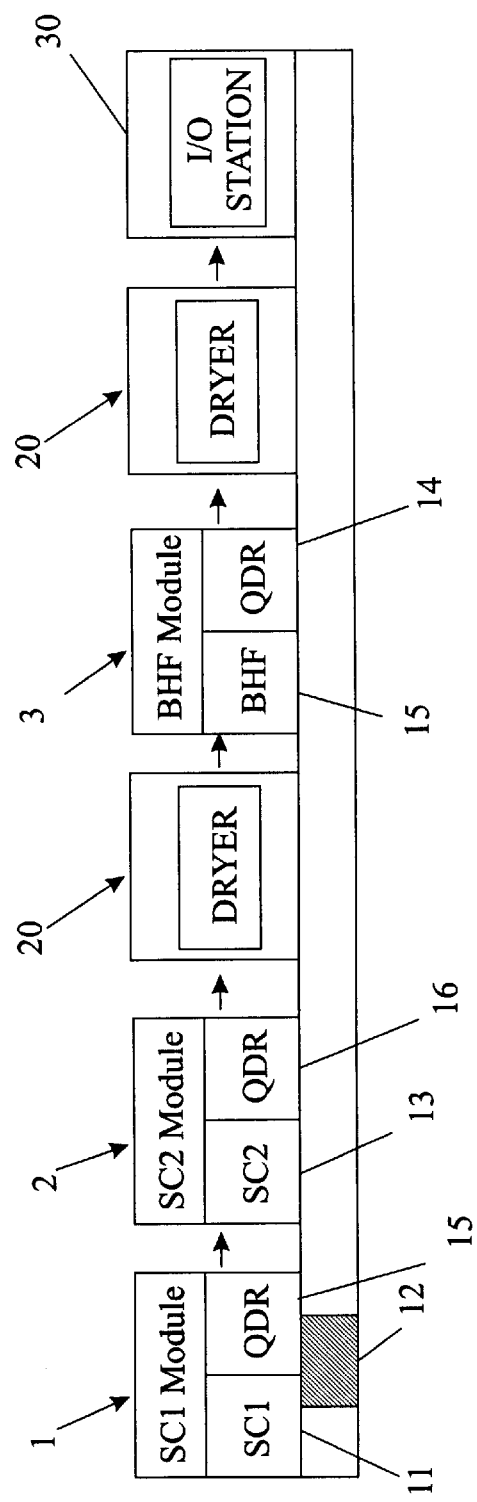

WET-DRY-WET PROCESS IN WET STATION

FIELD OF THE INVENTION

The present invention relates to an improved wet-washing method and apparatus for use in the fabrication of semiconductor devices. More specifically, the present invention relates to an improved but cost-effective post-etching rinsing and cleaning method and apparatus that are adjunct to the process of forming one or more electrically conductive channels through one or more dielectric layers to electrically connect two sandwiching conductive layers. The method and apparatus disclosed in the present invention can eliminate, or at least minimize, the unintended high electric resistance due to the presence of oxide that may be formed on the end face of the channel; they also prevent channel shorting problems when a plurality of channels are being formed in the same etching process. The method and apparatus disclosed in the present invention can also be advantageously utilized in other processes which involve two disparate wet-etching steps and wherein the second wet-etching stage requires a relatively invariant etching strength in order to avoid undesirable side effects.

BACKGROUND OF THE INVENTION

A rinsing and cleaning apparatus (RCA) is a necessary equipment in the fabrication of semiconductor devices. A rinsing and cleaning step is almost always required after the semiconductor wafers have been subjected to an etching process, and typically before they are subjected to other fabrication processes such as diffusion, thermal oxidation, chemical vapor deposition (CVD), etc. The main purpose of rinsing and cleaning is to remove the contamination, particles, organic molecules, metal ions, etc., that maybe left on the wafer surface before subjecting the wafer a subsequent process. Inadequate rinsing and cleaning can lead to poor yield and low product quality problems. However, due to the constant pricing pressure present in the semiconductor industry, semiconductor manufacturers must balance the thoroughness of the rinsing and cleaning procedure relative to the cost thereof. The completeness of rinsing and cleaning, become more critical during the fabrication of ULSI devices where there exists substantially less room for error.

FIG. 1 shows an illustrative schematic diagram of a typical wet washing station in a rinsing and cleaning apparatus. It includes an I/O Station for loading and unloading wafer to be wet washed. A robot 12 transports the wafer into various modules, such as BHF (buffered hydrogen fluoride) module, SC1 (standard clean 1) module, SC2 (standard clean 2) module. The BHF module is effective in removing oxides, SC1 (which typically contains a mixture of $NH_4OH$, $H_2O_2$, $H_2O$) is provided to remove particles, and SC2 (which typically contains a mixture of $HCl$, $H_2O_2$, $H_2O$) is provided to remove metal impurities. Each of the modules of BHF, SC1 and SC2 also contains a QDR (quick dump rinse), which is a water tank for a quick dump rinse of the wafer after going through the each wet wash main module. After the programmed washing steps, the wafer is sent to a dryer, where the wafer is dried, and finally back to the I/O station, where the dried wafer leaves the wet station. The sequence among the various washing modules can be programmed and can be out of order. However, in order to avoid undried wafer leaving the washing station, once the wafer enters the dryer, it cannot return to the washing modules, and must exit the wet washing station after the drying step.

The improved method and apparatus of the present invention were discovered when the co-inventors were investigating a yield problem during the fabrication of semiconductor devices which contain conductive channels (i.e., plugs) that are formed through a dielectric layer to electrically connect two conductive layers sandwiching the dielectric layer. After extensive and careful studies, the co-inventors of the present invention discovered that a native oxide layer can be formed on the surface of the bottom conductive layer, causing a high contact resistance to be present in the plug to be subsequently formed. The native oxide layer was formed due to the use of oxidizer such as hydrogen peroxide in the washing modules which released nascent oxygen atoms. The nascent oxygen atoms would react with the silicon atoms and form the native oxide layer, which is non-conductive.

One possible solution to this problem is to move the BBF module to the end of the wet washing process, making it a BHF-last wet washing station, so as to remove the native oxide. Since the native oxide layer is very thin, the BBF module is typically modified to become a diluted hydrogen fluoride (DHF), so as not to cause other complications. However, another problem arises when a DHF module is used. This occurred because the water-soaked wafer can dilute and adversely affect the strength of the DHF module, rendering it largely ineffective. If a higher strength BHF is used, it can result in different etching rates along the length of the channel, higher etching rate in the top (where etching is not required) and lower etching rate in the bottom (where high etching strength is required). In certain situations, for example, when multiple channels are formed in a relatively close area, short circuiting may occur, resulting in a yield failure.

SUMMARY OF THE INVENTION

The primary object of the present invention is to develop an improved method and apparatus for post-etching rinsing and cleaning operations for semiconductor wafers. More specifically, the primary object of the present invention is to develop an improved method and apparatus which will remove the native oxide layer that may be formed in a conductive channel, while preventing the occurrence of short-circuiting. The method and apparatus of the present invention eliminate the presence of the high contact resistence that often results in poor channel quality, they also avoid the circuit shorting problem which may occur as a result of over-correcting of the first problem. One of the main advantages of the present invention is that it improves both the quality and the yield rate of the channel-containing semiconductor devices in a very cost-effective manner. The method and apparatus of the present invention disclosed in the present invention can also be utilized in other semiconductor fabrication processes which involve two disparate wet washing processes, especially when the strength of the second wet washing process is of critical concern.

In the method disclosed in the present invention, the wet washing process is divided into two parts, the first part comprises at least one washing module which involves the use of an oxidative, agent. And the second part comprises a hydrogen fluoride wash step, which can be a buffered hydrogen fluoride (BHF) step or dilute hydrogen fluoride (DHF) step. A drying step is effectuated in between the two wet wash steps, so as not to dilute the effective strength of the second part wet wash. The method disclosed in the present allows the native oxide layer to be effectively removed, thus preventing the formation of high resistance contact on the conductive substrate. By not diluting the strength of the hydrogen fluoride bath, the method of the present invention eliminates the need for using a high strength solution initially. Thus, the present invention also prevents the over-etching problem that may result in circuit shorting problems when multiple channels are formed in a relatively close area.

Another problem arises when implementing the method discussed above. In order to prevent the un-dried wafer to leave the washing station, all the conventional rinsing and cleaning machines are structured such that the path from the washing modules to the dryer is one-directional. Thus, in order to provide the drying step prior to the second washing step, the wafer must be removed from the wet washing station, then start a new wet washing cycle. This can cause substantial increases in the fabrication time, and thus resulting substantially increased production cost.

In the present invention, the washing station is modified such that the dryer has an additional option to be treated as a module. In this manner, the wafer is allowed to be transported from the dryer module to the BHF or DHF module by the robot. After the BHF/DHP module, the dryer will be treated as a conventional dryer, allowing only one-directional movement out of the washing station. This modification greatly simplifies the effort and fabrication cost required for carrying the method of the present invention, and thus making it economically feasible.

BRIEF DESCRIPTION OF THE DRAWING

The present invention will be described in detail with reference to the drawing showing the preferred embodiment of the present invention, wherein:

FIG. 1 is a schematic diagram showing the steps of a conventional wet washing process.

FIG. 2 is a schematic diagram showing the steps of a re-arranged wet washing process.

FIG. 3 is a schematic diagram showing the diffusion of hydrogen fluoride etching solution from point A (top) to point B (bottom) in order to reach the native oxide layer at the bottom of the cavity.

FIG. 4 is a schematic diagram showing that the hydrogen fluoride etching solution is horizontally penetrating into the interface between two dielectric layers.

FIG. 5 is a schematic diagram showing that the top portion of the dielectric layer separating two conductive channels has been etched out, resulting in a shorting between the two subsequently formed conductive channels.

FIG. 6 is a schematic diagram showing the steps of the improved wet washing process according to a preferred embodiment of the present invention.

DETAILED DESCRIPTION OF THE PREFERRED EMBODIMENT

The present invention discloses an improved method and apparatus for post-etching rinsing and cleaning operations for semiconductor wafers. The present invention was discovered when the co-inventors were investigating a yield problem during the fabrication of conductive channels (i.e., conductive plugs) that are formed through a dielectric layer to electrically connect two conductive layers sandwiching the dielectric layer. The co-inventors of the present invention, after extensive and careful studies, discovered that a native oxide layer was often formed on the surface of the bottom conductive layer, which is typically a doped or polysilicon substrate. The presence of the native oxide layer causes a high contact resistance to be introduced in the path of the electric current, thus causing a degradation of the electric property of the channel. After further investigations, the co-inventors concluded that the native oxide, layer was formed due to the use of oxidizer such as hydrogen peroxide in the washing modules which released nascent oxygen atoms. The nascent oxygen atoms would react with the silicon atoms in the bottom substrate and form the native oxide layer, which is non-conductive.

One possible solution to this problem is to move the BHF module to the end of the washing cycle, making the process a BHF-last wet washing station, so as to remove the native oxide. Since the native oxide layer is very thin, the BHF module is modified to become a diluted hydrogen fluoride (DHF), so as not to cause other complications. However, another problem arises when a DHF module is used. This occurred because the water-soaked wafer can cause significant dilution and adversely affect the strength of the DHF module, rendering it largely ineffective. If a higher strength BHF is used, it can result in different etching rates along the length of the channel, i.e., higher etching rate in the top (where etching is not required) and lower etching rate in the bottom (where etching is required). In certain situations, for example, when multiple channels are formed in a relatively proximate area, short circuiting may occur, resulting in fabrication failure.

FIG. 2 shows an illustrative schematic diagram of a re-arranged wet washing stations constituting a rinsing and cleaning apparatus. It includes an I/O Station 30 for loading and unloading a wafer to be wet washed. A robot 12 transports the wafer into various modules, such as BHF (buffered hydrogen fluoride) module 3, SC1 (standard clean 1) module 1, SC2 (standard clean 2) module 2. As discussed above, the BHF module 3 has been moved to the end of the washing cycle to effectuate the removal of the native oxide layer. The BHF tank 15 is effective in removing oxides, SC1 (which typically contains a mixture of $NH_4OH$, $H_2O_2$, $H_2O$) 11 is provided to remove particles, and SC2 13 (which typically contains a mixture of HCl, $H_2O_2$, $H_2O$) is provided to remove metal impurities. Each of the module also contains a QDR (quick dump rinse) 14, 15, 16, which is a water tank for a quick dump rinse of the wafer after going through the each main module. After the programed washing steps, the wafer is sent to a dryer 20, where the wafer is dried, and finally back to the I/O station, where the dried wafer leaves the wet station. The sequence among the various washing modules can be programmed and can be out of order. However, in order to avoid undried wafer leaving the washing station, as discussed earlier, once the wafer enters the dryer, it cannot return to the washing modules, and must exit.

FIG. 3 is a schematic diagram showing the diffusion of hydrogen fluoride etching solution from point A (top) to point B (bottom) in order to reach the native oxide layer in the bottom of the cavity 100. Due to the rinse water trapped in the cavity, the strength of the hydrogen fluoride solution decreases as it travels into the bottom of the cavity, and may become ineffective when it reaches the native oxide layer which is intended to be removed. This problem may be ameliorated by increasing the strength of the hydrogen fluoride solution. However, this may cause a top heavy problem, and it may damage the top portions of the cavity in which the conductive channel is to be formed.

The use of a strong hydrogen fluoride solution can also cause other more serious problem, FIG. 4 is a schematic diagram showing that the hydrogen fluoride etching solution is penetrating into the interface 200 between two dielectric layers 201 and 202. An often encountered situation is that the dielectric layers comprise a BPSG layer and a TEOS layer, wherein B and P atoms will diffuse from the BPSG layer to the BPSG/TOS interface, causing it to be vulnerable to be attacked by the hydrogen fluoride solution. The long etching time due to the diluted hydrogen fluoride solution after it reaches the bottom of the cavity will allow the penetration to reach horizontally deep into the interface. Eventually, the penetration may reach deep enough to connect two cavities. When metal or poly-silicon is deposited to fill the cavities and thus form conductive channels, the interface will also be filled with the conductive metal or poly-silicon, causing the channels to be shorted.

Circuit shorting can also occur in semiconductor devices wherein the conductive channel penetrates into only a single dielectric layer. FIG. 5 is a schematic diagram showing that the top portion 303 of the dielectric layer 300 separating two conductive channels 301, 302, has been etched out, resulting in a shorting between the two conductive channels when the cavities are filled with a conductive metal or poly-silicon material.

FIG. 6 is a schematic diagram showing the steps of an improved wet washing process of the present invention. In the method disclosed in the present invention, the wet washing process is divided into two parts, the first part comprises at least one washing module which involves an oxidative agent to achieve good cleaning efficiency. And the second part comprises a hydrogen fluoride wash step, which can be a buffered hydrogen fluoride (BHF) step or dilute hydrogen fluoride (DHF) step, to remove the native oxide layer. A drying step is effectuated in between the two wet wash steps, so as not to dilute the effective strength of the second part wet wash. The method disclosed in the present allows the native oxide layer to be effectively removed, thus preventing the formation of high resistance contact on the conductive substrate. However, by not diluting the strength of the hydrogen fluoride bath, the method of the present invention eliminates the need for using a high strength solution initially. Thus, it also prevents the over-etching problem that may result in shorting problems when multiple channels are formed in a close area.

As discussed earlier, another problem arose when attempts were made to implement the method discussed above. In order to prevent the un-dried wafer to leave the washing station, all the conventional rinsing and cleaning machines are structured such that the path from the washing modules to the dryer is one-directional. Thus, in order to provide the drying step before the second washing step, the wafer must be removed from the wet washing station, then re-enter the wet washing station. This can cause substantial increase in the fabrication time, and thus resulting increased production cost.

In the present invention, the washing station is modified such that the dryer with provided with the an additional ability such that it can be treated as a one of the washing modules. In this manner, the wafer is allowed to be transported from the dryer module to the BHF or DHF module by the robot After the BHF/DHF module, the dryer will be treated as a conventional dryer, allowing only one-directional movement out of the washing station. This modification greatly simplifies the effort and fabrication cost required for carrying the method of the present invention, and thus making it economically feasible.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

A conventional rinse and clean apparatus was modified so that the dryer will accept an "intermediate" drying command, which will allow the wafer to return to one of the wet washing modules, in addition to the default exit-only operation A robot is programmed to move a wafer, in the order, to SC1 module, SC2 module, dryer, DHF/BHF module, dryer again, then exit. The SC1 module a chemical bath tank with an APM ($NH_4OH/H_2O_2$) receipt and a quick dump rinse water (de-ionized water) tank. The SC2 module a chemical bath tank with an HPM ($HCl/H_2O_2$) receipt and a quick dump rinse water tank. The DHF/BHF module contains a chemical bath tank with either a 100:1 diluted hydrogen fluoride solution or an ammonium fluoride buffered hydrogen fluoride solution. After the wafer is removed from the rinse and clean apparatus, it was examined. And the test results showed the absence of oxide layer and high integrity of the cavity walls.

The foregoing description of the preferred embodiments of this invention has been present for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for making conductive channel in a semiconductor wafer, comprising the steps of:
    (a) forming a through hole in a dielectric layer, which is formed above a conductive substrate;
    (b) subjecting said wafer to a first wet washing process which involves the use of an oxidizer that may form a native oxide layer on said conductive substrate;
    (c) subjecting said wafer to a first drying process;
    (d) subjecting said wafer to a second wet washing process to remove said native oxide layer formed on said conductive substrate;
    (e) subjecting said wafer to a second drying process; and
    (f) filling said through hole with a conductive material to form a conductive channel;
    (g) wherein said first wet washing process, said first drying process, said second wet washing process, and said second drying process are all conducted in a same wet washing station and in a continuous manner.

2. The method for making conductive channel in a semiconductor wafer according to claim 1 wherein either of said first or second wet washing process comprises the step of subjecting said wafer to a chemical bath.

3. The method for making conductive channel in a semiconductor wafer according to claim 2 wherein either of said first or second wet washing process further comprises the step of subjecting said wafer to quick dump rinse following said chemical bath.

4. The method for making conductive channel in a semiconductor wafer according to claim 1 wherein said first wet washing process comprises a chemical bath containing $NH_4OH$ and $H_2O_2$.

5. Method for making conductive channel in a semiconductor wafer according to claim 1 wherein said first wet washing process comprises a chemical bath containing HCl and $H_2O_2$.

6. The method for making conductive channel in a semiconductor wafer according to claim 1 wherein said first wet washing process comprises a first chemical bath containing $NH_4OH$ and $H_2O_2$ and a second chemical bath containing HCl and $H_2O_2$.

7. The method for making conductive channel in a semiconductor wafer according to claim 1 wherein said second wet washing process comprises a chemical bath containing either buffered hydrogen fluoride or 100:1 diluted hydrogen fluoride.

8. The method for making conductive channel in a semiconductor wafer according to claim 1 wherein said dielectric layer comprises two or more sub-layers separated by an interface.

9. The method for making conductive channel in a semiconductor wafer according to claim 1 wherein said dielectric layer comprises a BPSG sub-layer and a TEOS sub-layer separated by an interface.

10. The method for making conductive channel in a semiconductor wafer according to claim 1 wherein step (a) involves forming two or more through holes in said dielectric layer, so as to form two or more conductive channels simultaneously.

11. A method for making semiconductor devices in a wafer, comprising the steps of:

(a) performing an etching operation on said wafer;

(b) subjecting said wafer to a first wet washing process;

(c) subjecting said wafer to a first drying process;

(d) subjecting said wafer to a second wet washing process, wherein said second wet washing process is kept at a relatively constant strength; and (e) subjecting said wafer to a second drying process;

(g) wherein said first wet washing process, said first drying process, said second wet washing process, and said second drying process are all conducted in a same wet washing station and in a continuous manner.

12. The method for making semiconductor device in a semiconductor wafer according to claim 11 wherein either of said first or second wet washing process comprises the step of subjecting said wafer to a chemical bath.

13. The method for making semiconductor device in a semiconductor wafer according to claim 12 wherein either of said first or second wet washing process further comprises the step of subjecting said wafer to quick dump rinse following said chemical bath.

14. The method for making semiconductor device in a semiconductor wafer according to claim 11 wherein said first wet washing process comprises a chemical bath containing $NH_4OH$ and $H_2O_2$.

15. The method for making semiconductor device in a semiconductor wafer according to claim 11 wherein said first wet washing process comprises a chemical bath containing HCl and $H_2O_2$.

16. The method for making semiconductor device in a semiconductor wafer according to claim 11 wherein said first wet washing process comprises a first chemical bath containing $NH_4OH$ and $H_2O_2$ and a second chemical bath containing HCl and $H_2O_2$.

17. The method for making semiconductor device in a semiconductor wafer according to claim 11 wherein said second wet washing process comprises a chemical bath containing either buffered hydrogen fluoride or 100:1 diluted hydrogen fluoride.

18. The method for making semiconductor device in a semiconductor wafer according to claim 11 wherein said dielectric layer comprises two or more sub-layers separated by an interface.

19. The method for making semiconductor device in a semiconductor wafer according to claim 11 wherein said dielectric layer comprises a BPSG sub-layer and a TEOS sub-layer separated by an interface.

\* \* \* \* \*